United States Patent [19]

Ledzius et al.

[11] Patent Number: 5,357,252
[45] Date of Patent: Oct. 18, 1994

[54] SIGMA-DELTA MODULATOR WITH IMPROVED TONE REJECTION AND METHOD THEREFOR

[75] Inventors: Robert C. Ledzius, Austin; James S. Irwin, Paige, both of Tex.

[73] Assignee: Motorola, Inc., Schaumburg, Ill.

[21] Appl. No.: 34,967

[22] Filed: Mar. 22, 1993

[51] Int. Cl.5 .............................................. H03M 3/00
[52] U.S. Cl. ....................................... 341/143; 341/76
[58] Field of Search ..................... 341/76, 77, 143, 144

[56] References Cited

U.S. PATENT DOCUMENTS

| | | | |
|---|---|---|---|
| 4,876,543 | 10/1989 | van Bavel | 341/143 |
| 5,057,840 | 10/1991 | Ledzius et al. | 341/144 |
| 5,073,778 | 12/1991 | Ueki et al. | 341/131 |
| 5,134,402 | 7/1992 | Miyoshi | 341/144 |

Primary Examiner—Howard L. Williams
Attorney, Agent, or Firm—Paul J. Polansky

[57] ABSTRACT

A sigma-delta modulator (50, 100) attenuates a frequency domain characteristic of a feedback signal to a first stage (60) of the modulator (50, 100) near $f_s/2$, where $f_s$ is the modulator's (50, 100) clock frequency. The modulator (50, 100) thus virtually eliminates in-band tones which are characteristic of known sigma-delta modulators, without complex dithering schemes. In one embodiment, the sigma-delta modulator (50, 100) includes a two-tap finite impulse response (FIR) filter (80) within a feedback loop of the modulator (50, 100). The two-tap FIR filter (80) smoothes transitions at an output of a second stage (70) to provide the feedback signal to the first stage (60). This architecture is useful for either a digital-to-analog sigma-delta modulator (50) or an analog-to-digital sigma-delta modulator (100).

23 Claims, 3 Drawing Sheets

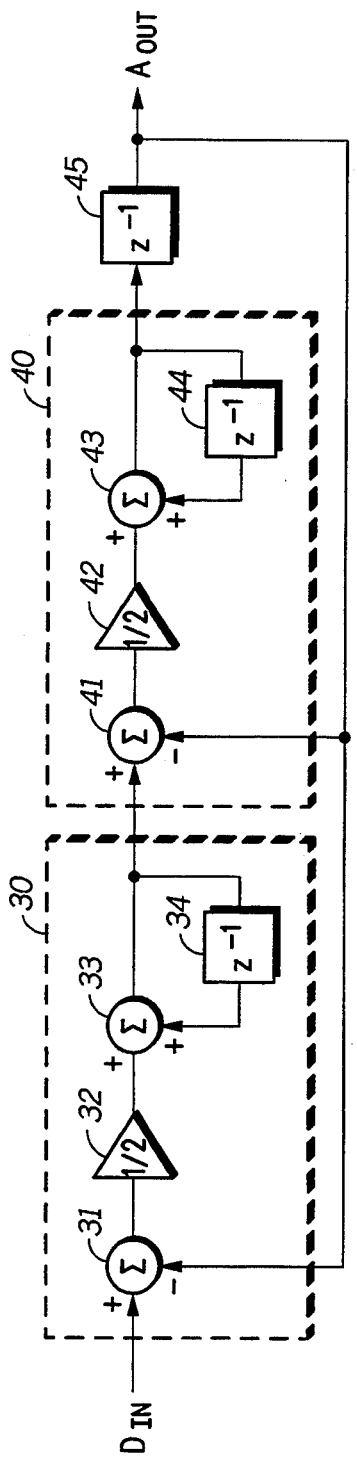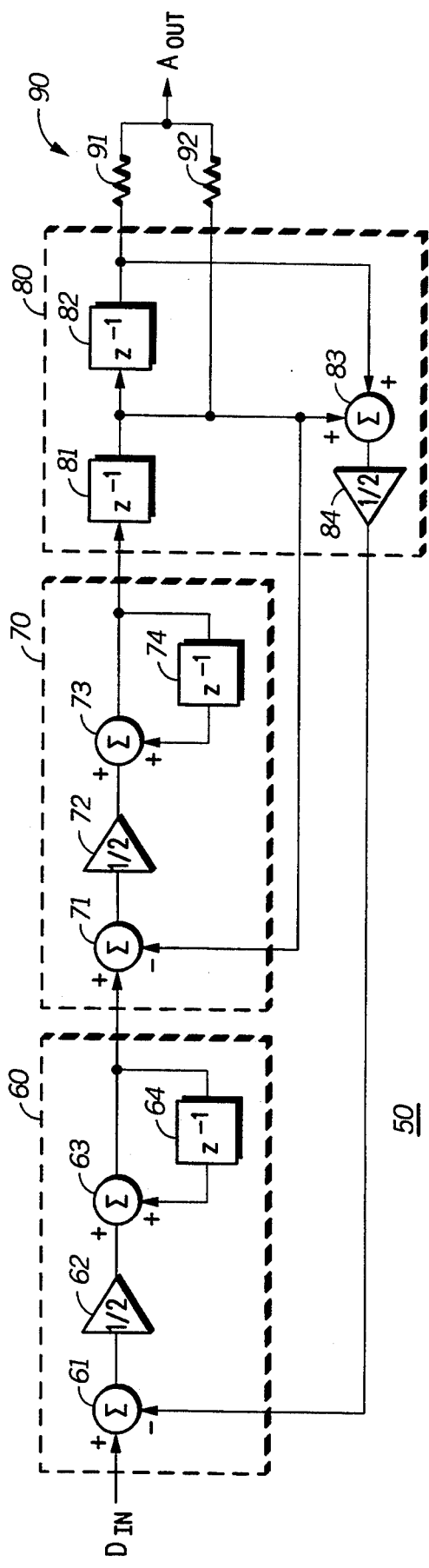

SIGMA-DELTA MODULATOR WITH IMPROVED TONE REJECTION AND METHOD THEREFOR

CROSS REFERENCE TO RELATED, COPENDING APPLICATION

Related, copending application is application Ser. No. 08/004,816, filed Jan. 15, 1993, by Robert C. Ledzius and James S. Irwin and assigned to the assignee hereof, entitled "Sigma-Delta Digital-to-Analog Converter with Reduced Noise".

FIELD OF THE INVENTION P This invention relates generally to data converters, and more particularly, to sigma-delta modulators for digital-to-analog or analog-to-digital converters.

BACKGROUND OF THE INVENTION

There are two basic techniques used in data converters. These are the sigma-delta technique and the resistive or capacitive divider techniques. The sigma-delta technique is attractive because it achieves high resolution by precise timing instead of precisely-matched on-chip components such as resistors. In addition, the expertise needed to produce thin-film, laser-trimmed analog components is difficult to obtain; whereas, high-speed digital switching capability is commonplace in the semiconductor industry. Sigma-delta modulators may be used in both analog-to-digital converters (ADCs) and digital-to-analog converters (DACs).

A basic sigma-delta modulator used in a DAC receives an input signal which is summed with inverse feedback of the output signal to provide an error signal. The error signal is attenuated and then processed through an integrator to provide the output signal. The sigma-delta modulator is able to shape the quantization noise out of the passband, where it can be filtered.

However, sigma-delta modulators are notorious for creating unwanted tones in the passband. These unwanted tones have frequencies which are linearly related to a DC bias of the input signal. The creation of these unwanted tones is worse for small input signals which are close to the signal ground level. Furthermore, during the time when the input signal is close to the ground level, it is easier for a listener to hear the unwanted tones. One generally accepted explanation of why sigma-delta modulators produce these unwanted tones is that the sigma-delta modulator creates pattern noises in order to resolve small incremental changes in the input signal. In a second-order sigma-delta modulator, the single-bit output, which is used as a feedback signal to two stages, has only a limited number of patterns to represent the small input signals around the signal ground level, and thus patterns have a large instantaneous error, causing the pattern noises to resonate further in the modulator. What is needed is a sigma-delta modulator which reduces or eliminates these in-band tones.

SUMMARY OF THE INVENTION

Accordingly, there is provided, in one form, a sigma-delta modulator with improved tone rejection, comprising a first stage, a second stage, an attenuation portion, and a feedback portion. The first stage has an input terminal for receiving an input signal, a feedback input terminal for receiving a first feedback signal, and an output terminal for providing a first output signal. The second stage has an input terminal coupled to the output terminal of the first stage, a feedback input terminal for receiving a second feedback signal, and an output terminal for providing a second output signal. The filter portion is coupled to the first and second stages. The filter portion attenuates a frequency domain characteristic of the second output signal near a frequency equal to one-half of a frequency of a clock of the sigma-delta modulator to provide a filtered signal. The filter portion provides the filtered signal as the first feedback signal. The feedback portion provides the second feedback signal in response to the second output signal. The sigma-delta modulator provides an output signal thereof in response to the second output signal.

In another form, there is provided a method for improving tone rejection of a sigma-delta modulator. An input signal is processed through a first stage of the sigma-delta modulator. An output of the first stage is processed through a second stage of the sigma-delta modulator. A frequency domain characteristic of an output of the second stage is attenuated near a frequency equal to one-half of a frequency of a clock of the sigma-delta modulator to provide a filtered signal. The filtered signal is provided as a feedback signal to the first stage. An output of the sigma-delta modulator is provided in response to the output of the second stage.

These and other features and advantages will be more clearly understood from the following detailed description taken in conjunction with the accompanying drawings.

BRIEF DESCRIPTION OF THE DRAWINGS

FIG. 1 illustrates in block diagram form a second-order sigma-delta modulator in accordance with the prior art.

FIG. 2 illustrates in block diagram form a sigma-delta modulator in accordance with the present invention, suitable for use in a digital-to-analog converter.

DETAILED DESCRIPTION OF A PREFERRED EMBODIMENT

Figure 3:
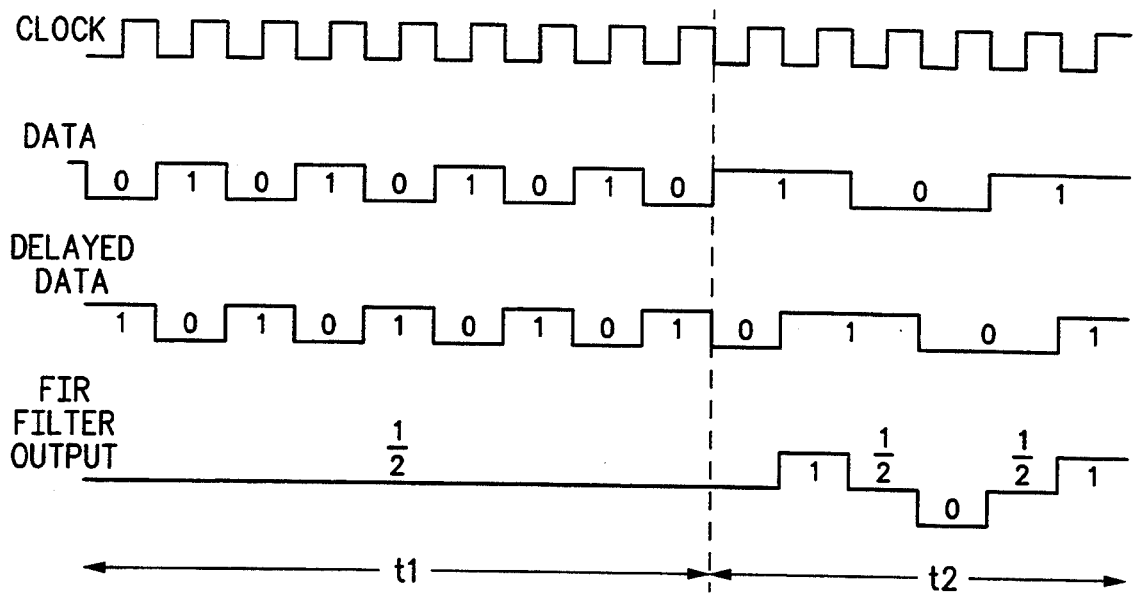
FIG. 3 is a timing diagram of signals pertinent to FIG. 2.

FIG. I illustrates in block diagram form a second-order sigma-delta modulator 20 in accordance with the prior art. Modulator 20 is suitable for use in a digital-to-analog converter (DAC), and receives an n-bit digital input signal labelled "$D_{IN}$", and provides an analog output signal labelled "$A_{OUT}$" in response. Modulator 20 is a second-order sigma delta modulator having a first stage 30 and a second stage 40. Each stage subtracts a corresponding feedback signal from an input thereof to provide an error signal, attenuates the error signal to provide an attenuated signal, and integrates the attenuated signal to provide an output thereof.

First stage 30 includes a summing device 31, an amplifier 32, a summing device 33, and a delay element 34. Summing device 31 has a positive input terminal for receiving $D_{IN}$, a negative input terminal for receiving $A_{OUT}$, and an output terminal for providing an n-bit sum thereof. Amplifier 32 has an input terminal connected to the output terminal of summing device 31, and an output terminal, and multiplies a value at the input terminal by one-half to provide a -value at the output terminal. Summing device 33 has a first positive input terminal connected to the output terminal of amplifier 32, a second positive input terminal, and an output terminal for providing a sum thereof. Delay element 34 has an input terminal connected to the output terminal of summing device 33, and an output connected to the second positive input terminal of summing device 33. Together, summing device 33 and delay element 34 form a first digital integrator.

Second stage 40 includes a summing device 41, an amplifier 42, a summing device 43, and a delay element 44. Summing device 41 has a positive input terminal connected to the output terminal of summing device 33, a negative input terminal for receiving signal $A_{OUT}$, and an output terminal. Amplifier 42 has an input terminal connected to the output terminal of summing device 41, and an output terminal, and multiplies a value at the input terminal by one-half to provide a value at the output terminal. Summing device 43 has a first positive input terminal connected to the output terminal of amplifier 42, a second positive input terminal, and an output terminal for providing a sum thereof. Delay element 44 has an input terminal connected to the output terminal of summing device 43, and an output terminal for providing the output terminal of second stage 40. Together, summing device 43 and delay element 44 form a second digital integrator.

An additional delay element 45 has an input terminal connected to the output terminal of second stage 40, and an output terminal. Modulator 20 provides delay element 45 in the feedback path to first stage 30 for stability. Modulator 20 provides its output, $A_{OUT}$, as the most significant bit (MSB) of the output of delay element 45, although modulator 20 may use the output of summing device 43 or delay element 44 as its output as well.

Modulator 20 is a conventional second-order sigma-delta modulator which is able to achieve a high signal-to-(noise +distortion) ratio by shaping quantization noise out-of-band. However, modulator 20 is susceptible to tones due to the nature of the sigma-delta technique. A modulator which has a reduced sensitivity to these tones in desirable.

FIG. 2 illustrates in block diagram form a second-order sigma-delta modulator 50 in accordance with the present invention. Modulator 50, like modulator 20, receives input signal $D_{IN}$ and provides output signal $A_{OUT}$ in response; however, modulator 50 significantly reduces undesired tones in the passband. Modulator 50 includes generally a first stage 60, a second stage 70, a two-tap FIR filter 80, and an output portion 90.

First stage 60 includes a summing device 61, an amplifier 62, a summing device 63, and a delay element 64. Summing device 61 has a positive input terminal for receiving $D_{IN}$, a negative input terminal for receiving a first feedback signal, and an output terminal for providing an n-bit sum thereof. Amplifier 62 has an input terminal connected to the output terminal of summing device 61, and an output terminal, and multiplies a value at the input terminal by one-half to provide a value at the output terminal. Summing device 63 has a first positive input terminal connected to the output terminal of amplifier 62, a second positive input terminal, and an output terminal for providing a sum thereof. Delay element 64 has an input terminal connected to the output terminal of summing device 63, and an output connected to the second positive input terminal of summing device 63. Together, summing device 63 and delay element 64 form a first digital integrator.

Second stage 70 includes a summing device 71, an amplifier 72, a summing device 73, and a delay element 74. Summing device 71 has a positive input terminal connected to the output terminal of summing device 63, a negative input terminal for receiving a second feedback signal, and an output terminal. Amplifier 72 has an input terminal connected to the output terminal of summing device 71, and an output terminal, and multiplies a value at the input terminal by one-half to provide a value at the output terminal. Summing device 73 has a first positive input terminal connected to the output terminal of amplifier 72, a second positive input terminal, and an output terminal for providing a sum thereof. Delay element 74 has an input terminal connected to the output terminal of summing device 73, and an output terminal connected to the second positive input terminal of summing device 73. Together, summing device 73 and delay element 74 form a second digital integrator.

FIR filter 80 includes single-bit delay elements 81 and 82, a summing device 83, and a multiplier 84. Delay element 81 has an input terminal connected to the output terminal of summing device 73 for receiving the MSB thereof, and an output terminal connected to the negative input terminal of summing device 71 and providing the second feedback signal. Delay element 82 has an input terminal connected to the output terminal of delay element 81, and an output terminal. Summing device 83 has a first positive input terminal connected to the output terminal of delay element 81, a second positive input terminal connected to the output terminal of delay element 82, and an output terminal. Multiplier 84 has an input terminal connected to the output terminal of summing device 83, and an output terminal for providing the first feedback signal, and multiplies a value at the input terminal by one-half to provide a value at the output terminal. Note that alternatively, the delay introduced by delay element 81 may be implemented as forward delay in first stage 60 or second stage 70.

Output portion 90 includes resistors 91 and 92. Resistor 91 has a first terminal connected to the output terminal of delay element 82, and an output terminal for providing signal $A_{OUT}$. Resistor 92 has a first terminal connected to the output terminal of delay element 81, and an output terminal connected to the second terminal of resistor 91. Resistors 91 and 92 preferably have the same resistance. Output portion 90 is optional, and the MSB output of summing device 73, delay element 81, or delay element 82 could also be provided as a single-bit analog output.

FIR filter 80 is within the feedback loop of modulator 50, and is a two-tap FIR filter with a zero placed at $f_s/2$, where $f_s$ is the modulator clock frequency. The first feedback signal, at the output of multiplier 84, is a three-level signal which smoothes out the quantizer transitions over two clock cycles. Multiplier 84 provides a two-bit feedback signal, corresponding to the most significant bit and the next-most-significant bit positions of $D_{IN}$. However, modulator 50 uses the unfiltered output of second stage 70 as the second feedback signal (after being delayed for one clock in delay element 81 ), since the additional phase delay of the filter would deteriorate the responsiveness of second stage 70. Modulator 50 has a slightly improved signal-to-noise ratio (SNR) compared to modulator 20 of FIG. 1, due to the two-bit output, but does not have a full 6 decibel (dB) improvement because the two bits are weighted equally and can represent only three quantization levels.

The frequency spectrum of modulator 50 is identical to that of modulator 20 of FIG. 1 except that modulator 50 provides a sin(x)/(x) response at $f_s/2$ due to FIR filter 80. This averaged feedback practically eliminates in-band tones when $D_{IN}$ is near signal ground. Modulator 50 significantly reduces these tones with only the additional elements of FIR filter 80, and without requiring a complex dither scheme. Modulator 50 does produce in-band tones for a bias of $D_{IN}$ around one-quarter and three-quarters full scale, but these in-band tones have a smaller amplitude than similar in-band tones produced by modulator 20, and the uncentered operation would represent an unusual operating condition for an audio converter.

The elements of modulator 50 may be implemented using conventional digital logic. Summing devices 61, 63, 71, 73, and 83 may be implemented with full adders; multipliers 62, 72, and 84 may be implemented by right-shifting the binary input signal by one bit position; and delay elements 64, 74, 81, and 82 may be implemented with D flip-flops clocked by the modulator's clock. Modulator 50 is preferably implemented with complementary metal-oxide semiconductor (CMOS) logic circuitry, which has relatively low power consumption and relatively high speed, but may be implemented in other transistor technologies as well.

FIG. 3 is a timing diagram of signals pertinent to FIG. 2. A signal labelled "CLOCK" represents the high-speed clock of modulator 50, having a frequency of $f_s$. The second signal in FIG. 3, labelled "DATA", represents a possible output of delay element 81. The third signal illustrated in FIG. 3, labelled "DELAYED DATA", is the output of delay element 82 The fourth signal in FIG. 3, labelled "FIR FILTER OUTPUT", represents the output of summing device 83, or equivalently, the output of multiplier 84. Both DATA and DELAYED DATA are single-bit digital signals having values of either "0" or "1", and are so designated in FIG. 3. However, FIR FILTER OUTPUT is a two-bit digital signal which is able to represent three levels, which are designated as "0", "½", and "1" in FIG. 3.

During a first portion of the time period illustrated in FIG. 3, labelled "t1", modulator 50 is providing an alternating pattern of zeros and ones at a frequency of $f_s/2$. This would occur when $D_{IN}$ is very nearly midscale. The FIR FILTER OUTPUT remains at a constant value of one-half, thus avoiding sharp transitions which would otherwise cause pattern noise in modulator 50. During a second time period, labelled "t2", DATA alternates at a "1" level for two CLOCK cycles followed by a "0" level for two CLOCK cycles. During t2, DATA is changing at a frequency of $f_s/4$. By having three levels, the FIR FILTER OUTPUT still provides some amount of smoothing to prevent the sharp transitions.

Figure 4:
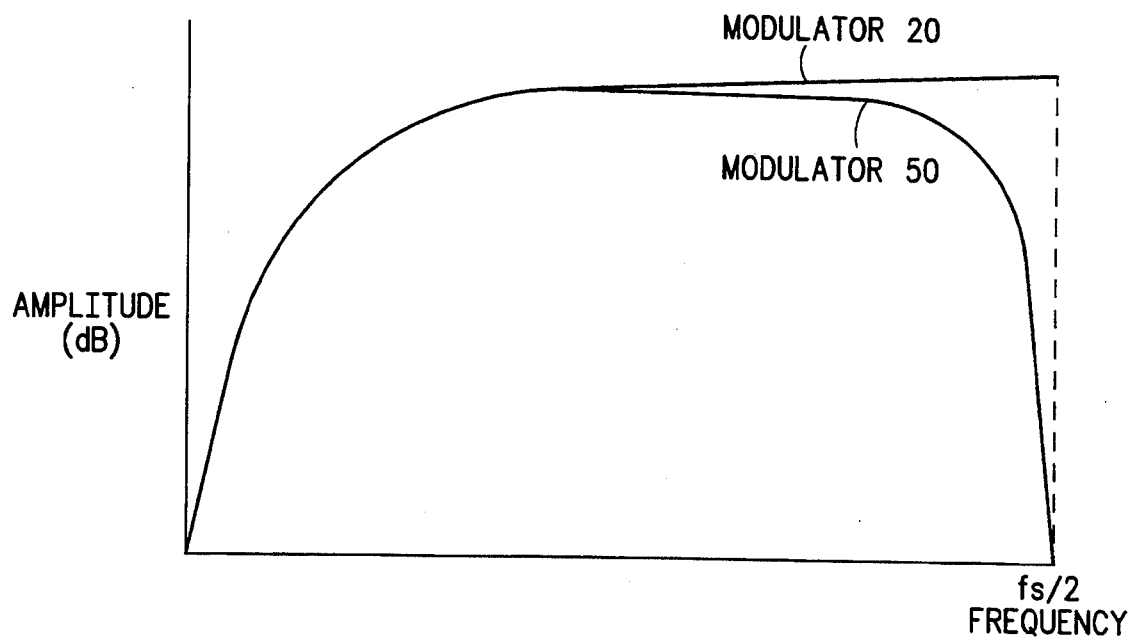
FIG. 4 is a graph in the frequency domain comparing the frequency response characteristic of the modulator of FIGS. 1 and 2.

FIG. 4 is a graph in the frequency domain comparing the frequency response characteristic of the modulator of FIGS. 1 and 2. In FIG. 4, the horizontal axis represents frequency, and the vertical axis represents the amplitude of $A_{OUT}$, in decibels (dB). A first curve, associated with prior art modulator 20 and the second feedback signal of modulator 50, has a response characteristic which rises 12 dB per octave from zero, and is relatively flat around $f_s/2$. However a second curve, associated with modulator 50, has a notch characteristic around $f_s/2$ which for a DAC has infinite attenuation at $f_s/2$. For an ADC, the notch attenuation is dependent of the matching of components in the FIR filter's summing device. By attenuating the energy in the signal at $f_s/2$, modulator 50 virtually eliminates tones caused by pattern noise for inputs near ground level.

Figure 5:
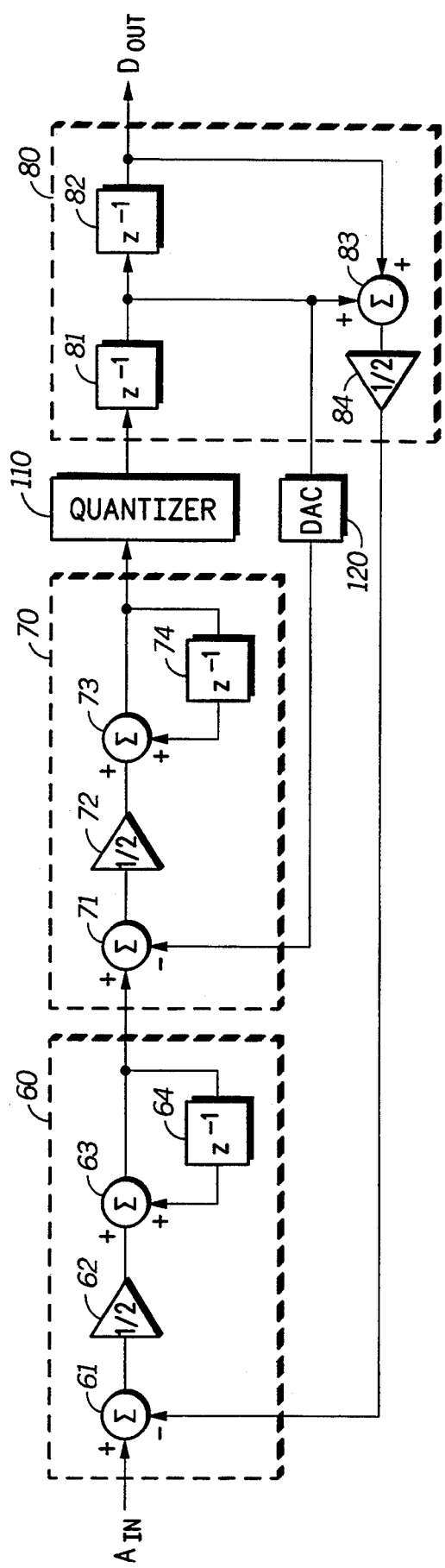
FIG. 5 illustrates in block diagram form a sigma-delta modulator in accordance with the present invention, suitable for use in an analog-to-digital converter.

FIG. 5 illustrates in block diagram form a sigma-delta modulator 100 in accordance with the present invention, suitable for use in an analog-to-digital converter. Elements in modulator 100 which are analogous to elements in modulator 50 have been given identical reference numbers. Modulator 100 includes first stage 60, second stage 70, a quantizer 110, FIR filter 80, and a feedback DAC 120. Modulator 100 receives an analog input signal labelled "$A_{IN}$", and provides a digital output signal labelled "$D_{OUT}$" in response. Modulator 100 is a second-order sigma delta modulator having two stages implemented in analog components. Each stage subtracts a corresponding feedback signal from an input thereof to provide an error signal, attenuates the error signal to provide an attenuated signal, and integrates the attenuated signal to provide an output thereof. The structures of first stage 60, second stage 70, and FIR filter 80 are identical to corresponding stages in FIG. 2. However, first stage 60 and second stage 70 are implemented with analog components to operate on analog signals. In FIR filter 80, delay elements 81 and 82 are digital as before, but summing device 83 and multiplier 84 are analog. Summing device 83 may be implemented with resistor summing such as by using equal-weighted resistors like resistors 91 and 92 used in output portion 90. Note that since filter 80 notches at $f_s/2$ and modulator 100 responds to lower frequencies, the matching of resistors in summing device 83, and the accuracy of multiplier 84, are not critical to the operation of modulator 100. Quantizer 110 is connected between the output of second stage 70 and the input of FIR filter 80, and converts the analog output of second stage 70 to a one-bit digital signal. DAC 120 converts the output of delay element 81 to an analog signal suitable for use in analog stage 70.

Most elements of modulator 100 may be implemented using conventional analog components. Summing device 83 may be implemented with resistor summing or the like; multipliers 62, 72, and 84 may be implemented with operational amplifiers; integrators in first stage 60 and second stage 70 may be implemented with switched-capacitor integrators or the like; and as stated earlier, delay elements 81 and 82 may be implemented with D flip-flops clocked by the modulator's clock.

While the invention has been described in the context of a preferred embodiment, it will be apparent to those skilled in the art that the present invention may be modified in numerous ways and may assume many embodiments other than that specifically set out and described above. For example, the modulator may have an order higher than second order by including additional stages. Also, an analog output in a DAC embodiment may be taken from the output of the second stage or from either of the FIR filter taps. Also, each modulator component may be implemented with a variety of circuit elements. Accordingly, it is intended by the appended claims to cover all modifications of the invention which fall within the true spirit and scope of the invention.

We claim:

1. A sigma-delta modulator with improved tone rejection, comprising:

a first stage having an input terminal for receiving an input signal, a feedback input terminal for receiving a first feedback signal, and an output terminal for providing a first output signal;

a second stage having an input terminal coupled to said output terminal of said first stage, a feedback input terminal for receiving a second feedback signal, and an output terminal for providing a second output signal;

filter means coupled to said first and second stages, for attenuating a frequency domain characteristic of said second output signal near a frequency equal to one-half of a frequency of a clock of the sigma-delta modulator to provide a filtered signal, and for providing said filtered signal as said first feedback signal; and feedback means coupled to said second stage, for providing said second feedback signal in response to said second output signal;

the sigma-delta modulator providing an output signal thereof in response to said second output signal.

2. The sigma-delta modulator of claim I wherein said filter means comprises a finite impulse response (FIR) filter having an input terminal coupled to said output terminal of said second stage, and an output terminal coupled to said feedback input terminal of said first stage for providing said first feedback signal.

3. The sigma-delta modulator of claim 2 wherein said FIR filter comprises:
   a first delay element having an input for receiving said second output signal, and an output;
   a second delay element having an input coupled to said output of said first delay element, and an output;
   a summing device having a first positive input coupled to said output of said first delay element, a second positive input coupled to said output of said second delay element, and an output; and
   a multiplier having an input coupled to said output of said summing device, and an output coupled to said feedback input terminal of said first stage for providing said first feedback signal.

4. The sigma-delta modulator of claim 3 further comprising output means, said output means comprising:
   a first resistor having a first terminal coupled to said output of said first delay element of said FIR filter, and a second terminal for providing said analog output signal; and
   a second resistor having a first terminal coupled to said output of said second delay element of said FIR filter, and a second terminal coupled to said second terminal of said first resistor.

5. The sigma-delta modulator of claim I wherein said first stage comprises:
   a summing device having a positive input terminal for receiving said input signal, a negative input for receiving said first feedback signal, and an output;
   a multiplier having an input coupled to said output of said summing device, and an output; and
   a integrator having an input coupled to said output of said multiplier, and an output for providing said first output signal.

6. The sigma-delta modulator of claim 1 wherein said second stage comprises:
   a summing device having a positive input terminal for receiving said first output signal, a negative input for receiving said second feedback signal, and an output;
   a multiplier having an input coupled to said output of said summing device, and an output; and
   a integrator having an input coupled to said output of said multiplier, and an output for providing said second output signal.

7. A sigma-delta modulator with improved tone rejection, comprising:
   a first stage having an input terminal for receiving an analog input signal, a feedback input terminal for receiving a first feedback signal, and an output terminal for providing a first output signal;
   a second stage having an input terminal coupled to said output terminal of said first stage, a feedback input terminal for receiving a second feedback signal, and an output terminal for providing a second output signal;
   a quantizer having an input terminal coupled to said output terminal of said second stage, and an output terminal for providing a third output signal;
   filter means coupled to said quantizer and to said first stage, for attenuating a frequency domain characteristic of said third output signal near a frequency equal to one-half of a frequency of a clock of the sigma-delta modulator to provide a filtered signal, and for providing said filtered signal as said first feedback signal; and
   feedback means having an input terminal coupled to said second stage, and an output terminal coupled to said feedback input terminal of said second stage for providing said second feedback signal;
   the sigma-delta modulator providing a digital output signal thereof in response to said third output signal.

8. The sigma-delta modulator of claim 7 wherein said filter means comprises a finite impulse response (FIR) filter having an input terminal coupled to said output terminal of said quantizer, and an output terminal coupled to said feedback input terminal of said first stage for providing said first feedback signal.

9. The sigma-delta modulator of claim 8 wherein said FIR filter comprises:
   a first delay element having an input for receiving said third output signal, and an output;
   a second delay element having an input coupled to said output of said first delay element, and an output;
   a summing device having a first positive input coupled to said output of said first delay element, a second positive input coupled to said output of said second delay element, and an output; and
   a multiplier having an input coupled to said output of said third summing device, and an output coupled to said feedback input of said first stage for providing said first feedback signal.

10. The sigma-delta modulator of claim 7 wherein said first stage comprises:
    a summing device having a positive input terminal for receiving said analog input signal, a negative input for receiving said first feedback signal, and an output;
    a multiplier having an input coupled to said output of said summing device, and an output; and
    a integrator having an input coupled to said output of said multiplier, and an output for providing said first output signal.

11. The sigma-delta modulator of claim 7 wherein said second stage comprises:
    a summing device having a positive input terminal for receiving said first output signal, a negative input for receiving said second feedback signal, and an output;

a multiplier having an input coupled to said output of said summing device, and an output; and a integrator having an input coupled to said output of said multiplier, and an output for providing said second output signal.

12. A method for improving tone rejection of a sigma-delta modulator, comprising the steps of:

processing an input signal through a first stage of the sigma-delta modulator;

processing an output of said first stage through a second stage of the sigma delta modulator;

attenuating a frequency domain characteristic of an output of said second stage near a frequency equal to one-half of a frequency of a clock of the sigma-delta modulator to provide a filtered signal;

providing said filtered signal as a feedback signal to said first stage; and providing an output signal of the sigma-delta modulator in response to said output of said second stage.

13. The method of claim 12 wherein said step of attenuating further comprises the step of attenuating a frequency domain characteristic of said output of said second stage near said frequency in a finite impulse response (FIR) filter to provide said filtered signal.

14. The method of claim 13 wherein said step of attenuating a frequency domain characteristic of said output of said second stage near said frequency in said FIR filter to provide said filtered signal comprises the steps of:

delaying said output of said second stage to provide a first delayed signal;

delaying said first delayed signal to provide a second delayed signal; and summing said first and second delayed signals to provide a sum signal; and attenuating said sum signal to provide said first feedback signal.

15. The method of claim 12 wherein said step of processing an input signal, through a first stage of the sigma-delta modulator comprises the steps of:

subtracting said feedback signal to said first stage from said input signal to provide a first error signal;

attenuating said first error signal to provide a first attenuated signal;

integrating said first attenuated signal to provide said output of said first stage.

16. The method of claim 12 further comprising the step of providing a feedback signal to the second stage in response to the output of the second stage.

17. The method of claim 16 wherein said step of processing an output of said first stage through a second stage of the sigma delta modulator comprises the steps of:

subtracting said feedback signal to said second stage from said output of said first stage to provide a second error signal;

attenuating said second error signal to provide a second attenuated signal; and integrating said second attenuated signal to provide said output of said second stage.

18. A method for improving tone rejection of a sigma-delta modulator, comprising the steps of:

processing an input signal through a first stage of the sigma-delta modulator;

processing an output of said first stage through a second stage of the sigma delta modulator;

quantizing an output of said second stage to provide a first output signal;

attenuating a frequency domain characteristic of said first output signal near a frequency equal to one-half of a frequency of a clock of the sigma-delta modulator to provide a filtered signal;

providing said filtered signal as a feedback signal to said first stage; and providing a second output signal of the sigma-delta modulator in response to said first output signal.

19. The method of claim 18 wherein said step of attenuating further comprises the step of attenuating a frequency domain characteristic of said output of said second stage near said frequency in a finite impulse response (FIR) filter to provide said filtered signal.

20. The method of claim 19 wherein said step of attenuating a frequency domain characteristic of said output of said second stage near said frequency in said FIR filter to provide said filtered signal comprises the steps of:

delaying said output of said second stage to provide a first delayed signal;

delaying said first delayed signal to provide a second delayed signal;

summing said first and second delayed signals to provide a sum signal; and attenuating said sum signal to provide said first feedback signal.

21. The method of claim 18 wherein said step of processing an input signal through a first stage of the sigma-delta modulator comprises the steps of:

subtracting said feedback signal to said first stage from said input signal to provide a first error signal;

attenuating said first error signal to provide a first attenuated signal;

integrating said first attenuated signal to provide said output of said first stage.

22. The method of claim 18 further comprising the steps of:

providing a third output signal in response to said first output signal;

converting said third output signal to an analog signal; and providing said analog signal as a feedback signal to said second stage.

23. The method of claim 22 wherein said step of processing an output of said first stage through a second stage of the sigma delta modulator comprises the steps of:

subtracting said feedback signal to said second stage from said output of said first stage to provide a second error signal;

attenuating said second error signal to provide a second attenuated signal;

integrating said second attenuated signal to provide said output of said second stage.

* * * * *